United States Patent
Lee

(10) Patent No.: US 6,277,697 B1
(45) Date of Patent: Aug. 21, 2001

(54) METHOD TO REDUCE INVERSE-NARROW-WIDTH EFFECT

(75) Inventor: Claymens Lee, Kaohsiung Hsien (TW)

(73) Assignee: United Microelectronics Corp., Hsinchu (TW)

(*) Notice: Subject to any disclaimer, the term of this patent is extended or adjusted under 35 U.S.C. 154(b) by 0 days.

(21) Appl. No.: 09/439,032

(22) Filed: Nov. 12, 1999

(51) Int. Cl.⁷ .................. H01L 21/336; H01L 21/76; H01L 21/425
(52) U.S. Cl. .................. 438/296; 438/424; 438/524
(58) Field of Search .................. 438/296, 524, 438/427, 433, 424, 437, 301, 217

(56) References Cited

U.S. PATENT DOCUMENTS

| | | | |
|---|---|---|---|
| 5,801,082 | * | 9/1998 | Tseng .................. 438/424 |
| 5,817,567 | * | 10/1998 | Jang et al. .................. 438/427 |
| 5,858,858 | * | 1/1999 | Park et al. .................. 438/424 |
| 5,915,195 | * | 6/1999 | Fulford, Jr. et al. .................. 438/524 |
| 5,937,308 | * | 8/1999 | Gardner et al. .................. 438/424 |
| 5,994,202 | * | 11/1999 | Gambino et al. .................. 438/433 |
| 6,093,953 | * | 7/2000 | Pan et al. .................. 257/510 |
| 6,103,562 | * | 8/2000 | Son et al. .................. 438/217 |
| 6,121,110 | * | 9/2000 | Hong et al. .................. 438/400 |
| 6,143,624 | * | 11/2000 | Kepler et al. .................. 438/433 |
| 6,165,871 | * | 12/2000 | Lim et al. .................. 438/437 |

* cited by examiner

Primary Examiner—John F. Niebling
Assistant Examiner—Walter L. Lindsay, Jr.
(74) Attorney, Agent, or Firm—Charles C. H. Wu; Charles C. H. Wu & Associates

(57) ABSTRACT

A method to reduce the inverse-narrow-line-effect is described in which an active region and an isolation region are defined on a substrate. A doped region is formed adjacent to the substrate surface, wherein the area of the doped region includes the isolation region and the edge of the active region. The depth of the doped region is shallower than that of the source/drain region formed subsequently. A shallow trench is formed thereafter in the isolation region adjacent to the active region, such that the doped region located in the substrate at the edge of the active region is retained. A liner oxide layer is further formed on the inner wall of the shallow trench. An oxide layer, which is as high as the surface of the cap layer, is formed to fill the trench. After the removal of the pad oxide layer and the cap layer, a gate oxide layer and a gate are formed on the substrate.

19 Claims, 2 Drawing Sheets

METHOD TO REDUCE INVERSE-NARROW-WIDTH EFFECT

BACKGROUND OF THE INVENTION

1. Field of the Invention

This invention relates to a fabrication method for an integrated circuit. More particularly, the invention relates to a fabrication method for an integrated circuit comprising a shallow trench isolation (STI) structure.

2. Description of the Related Art

In the fabrication of an integrated circuit comprising a shallow trench isolation structure, the oxide layer filling the shallow trench is damaged and forms a recess at the top edge corner of the trench during the removal of the pad oxide layer on the active region. The polysilicon, during its formation to become a gate, fills the recess. The top edge corner of the shallow trench isolation structure, as a result, is covered by the polysilicon, in which a local intensified field is induced, causing the transistor to have a lower threshold voltage in the area next to the shallow trench isolation structure and leading to an increase of the sub-threshold leakage of the transistor. As the line-width of an integrated circuit continues to be reduced, the effect of the local intensified field on the threshold voltage of a transistor becomes more significant. Since this phenomenon is opposite to the narrow-width-effect in which the threshold voltage increases with a reduction of the line width, it is therefore known as the inverse-narrow-width-effect.

In the conventional approach to reduce the inverse-narrow-width-effect. boron ions are implanted in the inner wall of the shallow trench to form a boron-doped region in the substrate along the shallow trench. The boron implantation is conducted after the formation of the trench and before the filling of the shallow trench with the oxide layer. The influence on the threshold voltage of a transistor by the local intensified field, because the top edge corner of the isolation structure is covered by polysilicon, is hence prevented. The boron doped region, formed according to the conventional approach, is distributed throughout the entire shallow trench sidewall and the substrate at the bottom of the trench. As a result, the P-N junction, formed by the connection of the boron-doped region and the source/drain region of the transistor, is in contact with the substrate. When the transistor is operating, the voltage applied to the transistor causes the P-N junction to generate a very high junction leakage in the substrate, seriously deteriorating the quality of the transistor. Especially in the dynamic random access memory (DRAM) cell structure, the junction leakage and the sub-threshold leakage due to the inverse-narrow-width-effect induce a serious drainage of the charge stored in the memory cell and greatly increase the frequency of the refresh cycle.

SUMMARY OF THE INVENTION

In the light of the foregoing, the present invention provides a method to effectively reduce the inverse-narrow-width-effect, in which the effect of the local intensified field on the threshold voltage at the edge of the shallow trench isolation structure is reduced. The problem of a junction leakage because of the P-N junction being in contact with the substrate is also prevented.

The present invention provides a method to effectively reduce the inverse-narrow-width-effect, in which a semiconductor substrate, covered by a pad oxide layer, is provided. A nitride layer and a cap oxide layer are sequentially formed to cover the pad oxide layer. Photolithography and etching is further conducted to remove a portion of the cap oxide layer and the nitride layer to define the active region and the isolation region. The cap layer formed by the nitride layer and the cap oxide layer covers the pad oxide layer on the active region. The pad oxide layer in the isolation region, however, is exposed. Using the cap layer as a mask, a doping process is conducted in which boron ions are implanted in the substrate to form a doped region adjacent to the upper surface of the substrate. The area of the doped region is formed, by means of tilt implantation, at the edge of the active region and in the substrate of the isolation region. The depth of the doped region is less than the depth of the source/drain region formed subsequently. Thereafter, a portion of the pad oxide layer, the doped region located in the isolation region and the underlying substrate are removed to form a shallow trench in the isolation region adjacent to the active region. Since the area of the doped region includes not only the isolation region, it also includes the edge of the active region. As a result, the substrate at the edge of the active region still comprises a portion of the doped region after the formation of the shallow trench. A liner oxide layer is further formed to cover the inner walls of the shallow trench. An oxide layer, which has the same height as the upper surface of the cap layer, is also formed to fill the shallow trench. The pad oxide layer and the cap layer in the active region are then removed by wet etching to expose the substrate in the active region. Thereafter, a gate oxide layer and a gate are formed on the substrate in the active region.

According to the above approach, removing the pad oxide layer and the cap layer in the active region by wet etching to expose the substrate in the active region may also form a recess at the top edge corner of the shallow trench, leading to the formation of a thicker gate. Since the doped region in the substrate at the edge of the active region can prevent the influence of the local intensified field on the threshold voltage of the transistor, the inverse-narrow-width-effect is thereby mitigated.

In addition, the depth of the doped region formed according to the present invention is shallower than the depth of the source/drain region, the P-N junction formed between the doped region and the source/drain region is therefore not in contact with the substrate. The junction leakage is therefore effectively reduced.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENT

Figure 1A:
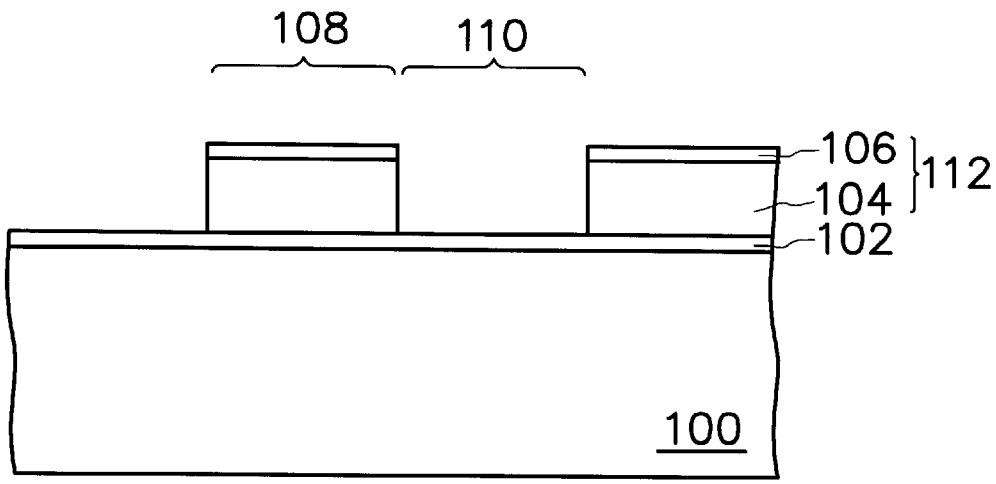
FIGS. 1A to 1F are schematic, cross-sectional views showing the method to reduce the inverse-narrow-width-effect according to the preferred embodiment of the present invention.

Referring to FIG. 1A, a semiconductor substrate 100 covered by a pad oxide layer 102 is provided. Thereafter, a nitride layer 104 and a cap oxide layer 106 are sequentially formed to cover the pad oxide layer 102. A portion of the cap oxide layer 106 and the nitride layer 104 are removed to define the active region 108 and the isolation region 110. The cap oxide layer 106 and the nitride layer 104 together form the cap layer 112 to cover the pad oxide layer 102 in the active region 108. The pad oxide layer 102 in the isolation region 110, however, is exposed. The pattern of the cap layer 112 is defined by photolithography and etching.

Figure 1B:
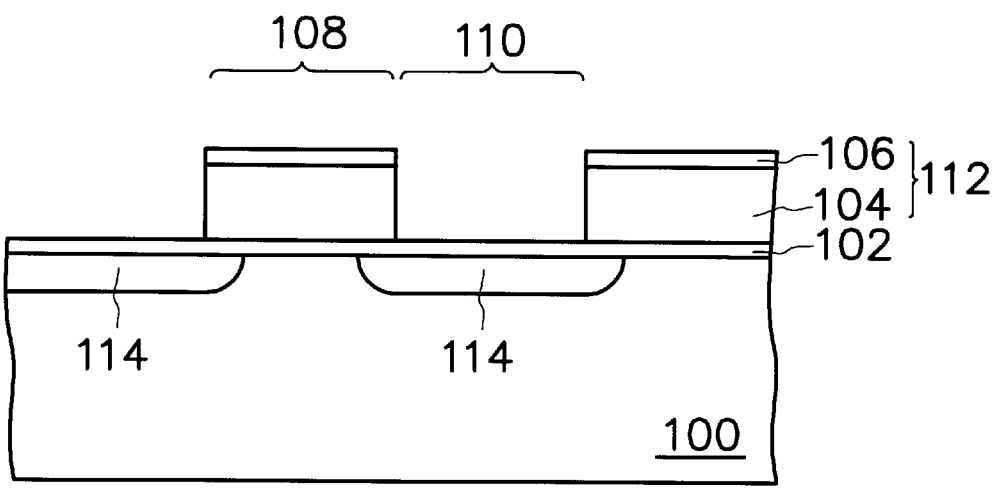

As shown in FIG. 1B, using the cap layer 112 as a mask, a doping process is conducted on the substrate 100 to form a doped region 114 in the substrate 100, adjacent to the upper surface of the substrate 100. A tilt implantation is conducted to implant boron ions in the substrate 100. The area of the doped region 114 includes the substrate 100 at the edge of the active region 108 and the substrate 100 in the isolation region 110. The depth of the doped region 114 is shallower than the depth of the source/drain region (not shown) formed subsequently.

Figure 1C:
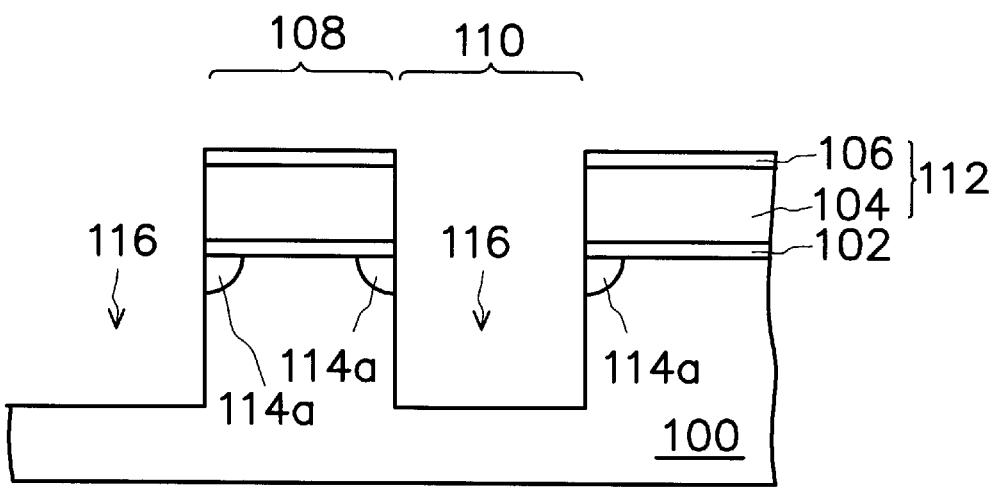

Referring to FIG. 1C, the pad oxide layer 102, a portion of the doped region 114 (FIG. 1B) and a portion of the substrate 100 in the isolation region 110 are removed to form a shallow trench 116 in the isolation region 110. The shallow trench 116 is formed adjacent to the active region 108. Since the area of the previously formed doped region 114 includes not only the isolation region, it also includes the edge of the active region 108. After the formation of the shallow trench 116, the substrate 100 at the edge of the active region 108 still comprises a portion of the doped region 114a.

Figure 1D:
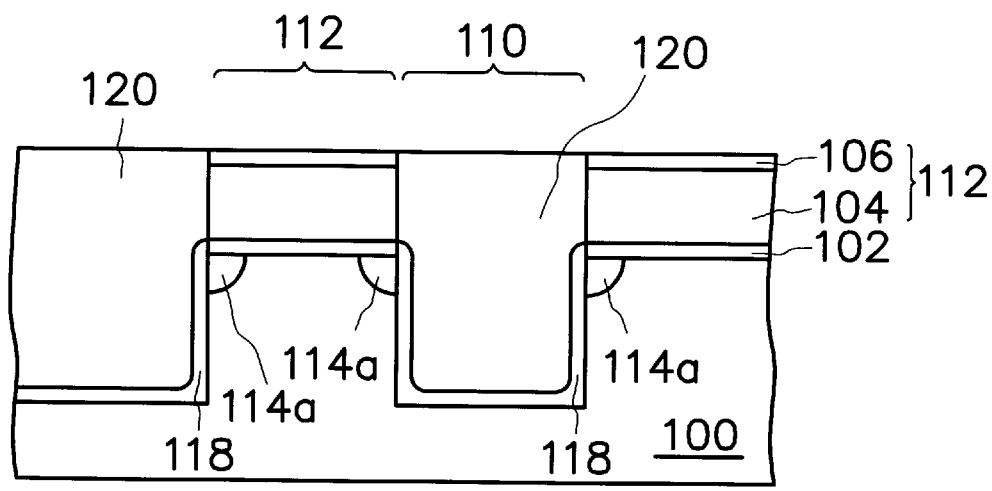

Referring to FIG. 1D, a liner oxide layer 118 is formed to cover the inner wall of the shallow trench 116 (FIG. 1C). An oxide layer 120 is further formed in the shallow trench 116, in which the oxide layer 120 has the same height as the upper surface of the cap layer 112. The oxide layer 120 is formed by, for example, atmospheric pressure chemical vapor deposition (APCVD) to deposit a layer of an oxide material that covers the substrate 100 and fills the shallow trench 116. A densification process is further conducted, followed by chemical mechanical polishing the oxide material to the height of the cap layer 112.

Figure 1E:
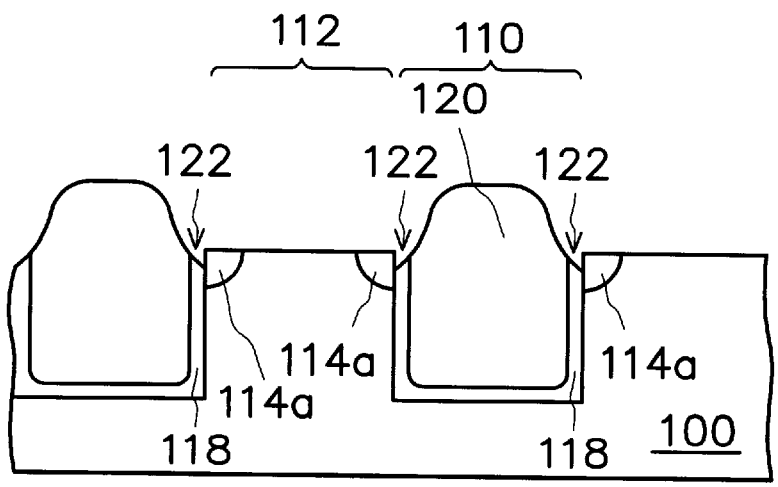

As shown in FIG. 1E, the cap layer 112 (FIG. 1C) and the pad oxide layer 102 (FIG. 1C) in the active region 108 are removed by, for example, wet etching, to expose the substrate 100 in the active region 108. During the removal of the pad oxide layer 102 and the cap layer 112 in the active region 108, the edge of the oxide layer 120 is likely to be etched to form a recess 122 at the top edge corner of the shallow trench 116.

Figure 1F:
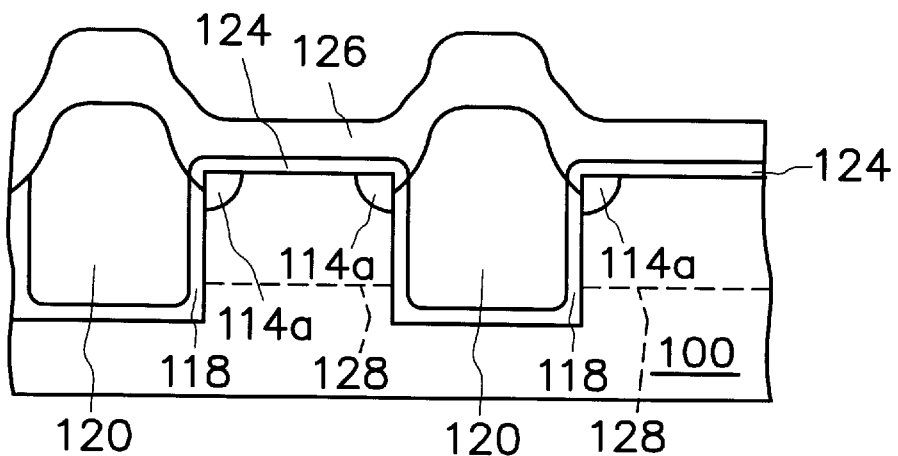

Referring to FIG. 1F, a gate oxide layer 124 is formed to cover the substrate 100 surface of the active region 108. A gate 126 is further formed to cover the oxide layer 120 and the gate oxide layer 124. The gate oxide layer is formed by, for example, thermal oxidation. The gate 126 is formed by, for example, forming a layer of polysilicon to cover the substrate 100, followed by defining the gate 126 by means of photolithography and etching.

In addition, according to the present invention, after removal of the pad oxide layer 102 and the cap layer 112 in the active region 108, a sacrificial oxide layer (not shown) is formed to cover the substrate 100 in the active region 108. Means to remove the sacrificial oxide layer can further improve the substrate 100 surface in the active region 108 and improve the quality of the gate oxide layer 124 formed subsequently.

To further clarify the embodiment of the present invention, the dotted line 128 depicted in FIG. 1F indicates the depth of the junction of the subsequently formed source/drain region (not shown). As illustrated in FIG. 1F, the depth of the doped region 114a is shallower than the junction depth of the source/drain region. As a result, although a P-N junction is still formed between the doped region 114a and the source/drain region, the P-N junction is not connected to the underlying substrate 100 of the source/drain region. The problem of a current leakage is thus effectively prevented.

A main feature of the present invention is the formation of a doped region 114a in the substrate 100 at the edge of the active region 108 such that the depth of the doped region 114a is shallower than the junction depth of the subsequently formed source/drain region. Since the doped region 114a can effectively prevent the local intensified field due to the covering of the top edge corner of the isolated region by the gate, the inverse-narrow-width-effect is thereby reduced. In addition, because the depth of the doped region is shallower than the junction depth of the source/drain region, the problem of a current leakage can also be avoided.

Since the present invention effectively lowers the sub-threshold leakage caused by the reverse-narrow-width-effect and prevents the occurrence of the junction leakage problem, the present invention can be widely applied to the various integrated circuits comprising a shallow trench structure. Since the sub-threshold leakage and the junction current leakage tend to cause a serious drainage to the charge stored in the memory cell, especially in the DRAM cell structure, the present invention provides a method to effectively increase the memory cell function and to lower the frequency of the refresh cycle.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A method to reduce the inverse-narrow-width-effect, which is applicable to fabrication of an integrated circuit comprising a shallow trench isolation structure, the method comprising the steps of:

providing a semiconductor substrate which comprises a pad oxide layer;

forming a patterned cap layer on the pad oxide layer to define an active region and an isolation region, wherein the cap layer covers the active region with the isolation region being exposed;

forming a doped region in the substrate adjacent to a surface of the substrate, wherein the depth of the doped region is less than the junction depth of a subsequently formed source/drain region and an area of the doped region includes the substrate in the isolation region, with a portion thereof being extended to the substrate in the active region;

forming a shallow trench in the isolation region, wherein the shallow trench is adjacent to the active region;

forming an oxide layer to fill the shallow trench, wherein an upper surface of the oxide layer and an upper surface of the cap layer are at a same height;

removing the cap layer and the pad oxide layer to expose the substrate in the active region;

forming a gate oxide layer to cover the substrate in the active region; and forming a gate to cover the gate oxide layer.

2. The method to reduce the inverse-narrow-width effect according to claim 1, wherein the doped region is formed by implanting boron ions in the substrate of the isolation region and at an edge of the active region while using the cap layer as a mask.

3. The method to reduce the inverse-narrow-width effect according to claim 1, wherein boron ions are implanted by tilt implantation.

4. The method to reduce the inverse-narrow-width effect according to claim 1, wherein the cap layer includes a nitride layer and a cap oxide layer.

5. The method to reduce the inverse-narrow-width effect according to claim 1, wherein forming the shallow trench includes removing the pad oxide layer, the doped region and a portion of the substrate in the isolation region.

6. The method to reduce the inverse-narrow-width-effect according to claim 1, wherein the step of forming the oxide layer includes:

forming an oxide material to cover the substrate and to fill the shallow trench;

conducting a densification process; and chemical mechanical polishing the oxide material to a height of the upper surface of the cap layer.

7. The method to reduce the inverse-narrow-width effect according to claim 1, wherein the formation of the oxide material further includes atmospheric pressure chemical vapor deposition.

8. The method to reduce the inverse-narrow-width effect according to claim 1, wherein the method further includes forming a liner oxide layer to cover an inner wall of the shallow trench before forming the oxide layer.

9. The method to reduce the inverse-narrow-width-effect according to claim 1, wherein the method further includes conducting a process to improve the substrate surface in the active region before formation of the gate oxide layer, the process including:

forming a sacrificial oxide layer to cover the substrate in the active region; and removing the sacrificial oxide layer.

10. The method to reduce the inverse-narrow-width effect according to claim 1, wherein forming the gate oxide layer includes thermal oxidation.

11. A method to reduce the inverse-narrow-width-effect, comprising the steps of:

providing a substrate having an active region and an isolation region adjacent to each other;

forming a doped region in the substrate, wherein an area of the doped region includes the substrate in the isolation region, with a portion thereof being extended to the substrate in the active region; and forming a shallow trench in the isolation region.

12. The method to reduce the inverse-narrow-width effect according to claim 11, wherein defining the active region and the isolation region in the substrate includes forming a patterned cap layer on the substrate, such that a portion of the substrate covered by the cap layer is the active region and a portion of the substrate not covered by the cap layer is the isolation region.

13. The method to reduce the inverse-narrow-width effect according to claim 12, wherein the cap layer includes a nitride layer and a cap oxide layer.

14. The method to reduce the inverse-narrow-width effect according to claim 11, wherein forming the doped region includes implanting boron ions in the substrate of the isolation region and at an edge of the active region by means of tilt implantation, using the cap layer as a mask.

15. The method to reduce the inverse-narrow-width-effect according to claim 14, wherein boron ions are implanted by means of tilt implantation.

16. The method to reduce the inverse-narrow-width-effect according to claim 11, wherein the method further includes forming a gate oxide layer and a gate to cover the substrate in the active region.

17. A method to reduce the inverse-narrow-width-effect, which is applicable to manufacturing a dynamic random access memory cell, the method comprising the steps of:

providing a substrate having an active region and an isolation region adjacent to each other;

forming a doped region in the substrate, wherein an area of the doped region includes the substrate in the isolation region, with a portion thereof being extended to the substrate in the active region; and forming a shallow trench in the isolation region, wherein the shallow trench is adjacent to the active region.

18. The method to reduce the inverse-narrow-width effect according to claim 17, wherein forming the doped region includes implanting boron ions in the substrate of the isolation region and at an edge of the active region by means of tilt implantation using the cap layer as a mask.

19. The method to reduce the inverse-narrow-width-effect according to claim 17, wherein the method further includes forming a gate oxide layer and a gate to cover the substrate in the active region.

* * * * *